United States Patent [19]

Del Monte

[11] Patent Number: 4,481,403

[45] Date of Patent: Nov. 6, 1984

[54] TEMPERATURE CONTROL OF SOLID STATE CIRCUIT CHIPS

[75] Inventor: Lou A. Del Monte, Minnetonka, Minn.

[73] Assignee: Honeywell Inc., Minneapolis, Minn.

[21] Appl. No.: 471,986

[22] Filed: Mar. 4, 1983

[51] Int. Cl.³ .............................................. H05B 1/02
[52] U.S. Cl. ..................................... 219/209; 219/499
[58] Field of Search ............... 219/209, 501, 508, 499; 361/400, 403; 29/840; 357/68, 69, 28; 307/310

[56] References Cited

U.S. PATENT DOCUMENTS

| | | | |
|---|---|---|---|
| 2,787,750 | 4/1957 | Jones | 219/209 |
| 3,887,785 | 6/1975 | Ahlport | 219/209 |
| 4,374,316 | 2/1983 | Inamori | 219/209 |
| 4,385,310 | 5/1983 | Houston | 357/68 |
| 4,413,308 | 11/1983 | Brown | 361/403 |
| 4,417,296 | 11/1983 | Schelhorn | 361/403 |

OTHER PUBLICATIONS

Greenhouse, Harold M., "Design of Temperature-Controlled Substrates...", Microelectronics, vol. 6, No. 1, Sep. 1974.

Primary Examiner—C. L. Albritton
Assistant Examiner—Teresa J. Walberg
Attorney, Agent, or Firm—Charles J. Ungemach

[57] ABSTRACT

Controlled heater apparatus for selectively heating a solid state circuit chip and the substrate upon which it is mounted by a solder bump so as to cause substantially equal expansion and contraction in the chip and substrate to relieve stress on the connecting solder bump.

9 Claims, 2 Drawing Figures

TEMPERATURE CONTROL OF SOLID STATE CIRCUIT CHIPS

BACKGROUND OF THE INVENTION

A continuing problem exists in the solid state circuitry art where a circuit chip is connected to a substrate by a solder connection referred to as a "bump." The circuit components on the chip and on the substrate produce heat when they are operating which frequently causes different amounts of expansion and contraction of the chip and the substrate which may produce considerable stress on the "bumps" even to the point of fracture and failure. The present invention has a purpose to greatly improve the failure rate which occurs due to the different heating effects occurring in the chip and in the substrate to which it is bonded.

SUMMARY OF THE INVENTION

The present invention provides heating resistors on the chip or on the substrate or both whose purpose is to increase the heat to the chip and/or the substrate by an amount sufficient to make the expansion and contraction of the chip and the substrate substantially equal when they are heating and cooling during use. More specifically, one or more heaters and temperature sensors are located on the chip and/or on the substrate and control circuitry is provided which operates in accordance with the temperature of the chip and the substrate detected by the sensors and the known difference in the thermal coefficients of expansion of the two components to apply heat to the chip and/or substrate through the heating resistors in an amount necessary to compensate for the difference in expansion and contraction.

DETAILED DESCRIPTION OF THE PREFERRED EMBODIMENTS

Figure 1:
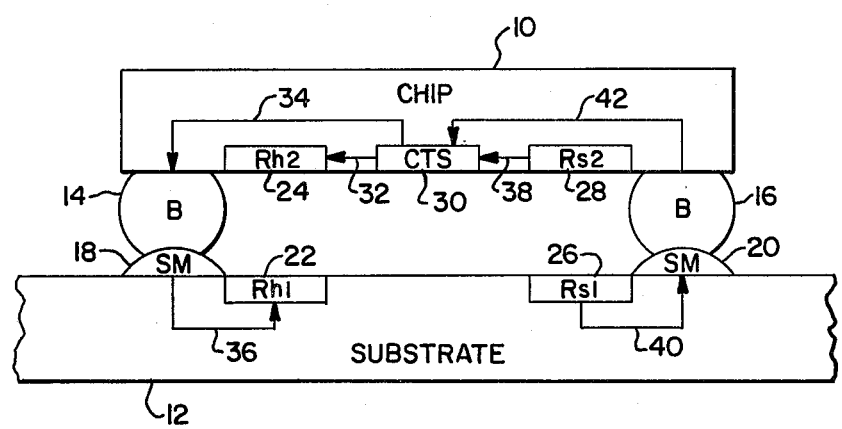
FIG. 1 shows a chip mounted on a substrate and a block diagram of the circuitry used.

In FIG. 1 a circuit chip 10 is shown connected to a substrate 12 by means of two solder "bumps" 14 and 16 connected to the chip 10 and to a substrate metalization 18 and 20 on the substrate.

Without the present invention as the electronic components on the chip 10 were used, heat would be produced to cause an expansion of the chip 10 which would usually be different than the expansion of the substrate 12 thereby putting extreme stress on the bumps 14 and 16 and often causing them to fracture to produce a failure.

To overcome this problem FIG. 1 shows a heating resistor Rh1 identified by reference numeral 22 which may be a resistor deposited on the substrate and operable to cause the substrate to heat up as the chip 10 heats up so as to produce the same amount of expansion in the substrate 12 as occurs in the chip 10. A second heating resistor Rh2 identified by reference numeral 24 is shown which may also be a resistor deposited on the chip and operable to produce additional heat in the chip 10 when desired, as, for example, when the electronic components are "shut off" which may cool the chip 10 more rapidly than the substrate 12. Heating chip 10 would then cause it to cool in the same manner as the substrate 10 to make the contraction of the chip and the substrate substantially equal. Thus by proper control of heating elements 22 and 24, the expansion and contraction of the chip and substrate may be maintained substantially equal during heating and cooling so as to relieve the stress on the "bumps" and greatly reduce the amount of failures which occur.

In order to control the heating and cooling of the chip and substrate, a pair of temperature sensing resistors Rs1 and Rs2 are shown identified by reference numerals 26 and 28 respectively and which may be temperature sensitive resistors deposited on the substrate 12 and the chip 10 respectively to detect the temperatures thereof. Of course the coefficients of thermal expansion of the chip and the substrate are known so that the amount of heating of the resistors Rh1 and Rh2 for various temperature changes detected by Rs1 and Rs2 can be determined as will be discussed in connection with the explanation of FIG. 2 hereinafter.

FIG. 1 also shows a control circuit 30 which may be part of the electronics of chip 10 is operable to control the heating of resistor Rh2 through a connection shown by an arrow 32 and operable to control the heating of resistor Rh1 by means of a connection shown as an arrow 34, solder bump 14, surface metalization 18, and an arrow 36. The control circuit 30 receives information with respect to the temperature of the chip 10 from Rs2 by means of a connection shown as an arrow 38 and receives information concerning the temperature of the substrate 12 from the sensing resistor Rs1 by means of a connection shown as an arrow 40, surface metalization 20, solder bump 16, and an arrow 42. It can be seen that the temperature of the substrate and the temperature of the chip are sensed by resistors Rs1 and Rs2 and signals indicative of these values are presented to the control circuit 30 which operates to produce heating effects on Rh2 and Rh1 in accordance with the desired expansion and contraction of the chip 10 and substrate 12.

Although the control circuit 30 is shown as part of the circuitry of the chip 10 in FIG. 1, it should be understood that the control circuitry could also be included in the circuitry of the substrate 12 or could be a separate element entirely if desired. The heating resistors Rh1 and Rh2 would normally be made to weave around the circuitry of the chip and the substrate so as to provide a more or less desired uniform heating of the chip and substrate and also the temperature sensing resistors Rs1 and Rs2 would normally be made to weave around the circuitry of the chip and substrate so as to receive an accurate indication of the general temperatures of the chip and substrate for use by the control circuitry.

Figure 2:
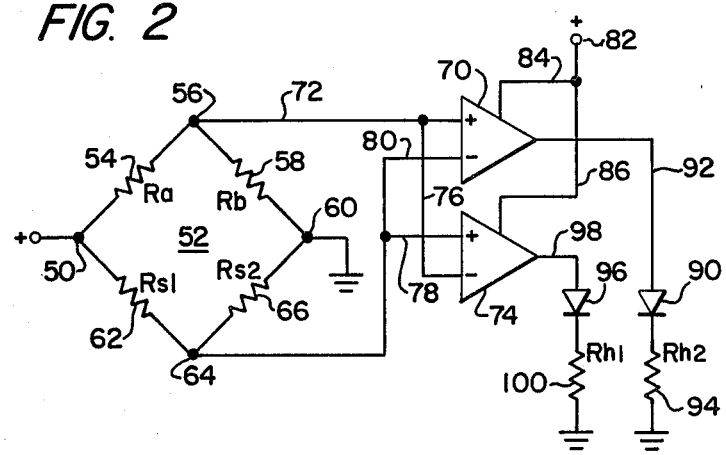
FIG. 2 shows a schematic diagram of the sensing and heating circuitry.

Referring now to FIG. 2 there is shown a schematic diagram for a control circuit useful in connection with the chip and substrate of FIG. 1. In FIG. 2 a source of positive potential is shown presented to a terminal 50 which forms one junction of a Wheatstone bridge identified by reference numeral 52. Terminal 50 is connected by a fixed resistor Ra identified by reference numeral 54 between junction 50 and a junction 56. Junction 56 is connected by a fixed resistor Rb identified by reference numeral 58 to a terminal 60 which is shown connected to signal ground. Terminal 50 is also connected by a resistor Rs1 identified by reference numeral 62 to a junction point 64. Junction point 64 is shown connected by a resistor Rs2 identified by reference numeral 66 to the grounded terminal 60.

Resistors Rs1 and Rs2 are the same as sensing resistors 26 and 28. The temperature coefficients of resistance for Rs1 and Rs2 are chosen so as to match the temperature coefficient of thermal expansion of the chip 10 and substrate 12. For example, if the chip 10 and substrate 12 had the same coefficient of thermal expansion as would usually be the case with a silicon chip and a silicon substrate, then resistors Rs1 and Rs2 would be equal. If the chip and substrate were of materials having different temperature coefficients, for example, the chip expanded at a faster rate than the substrate, then the temperature coefficient of resistance of Rs1 would be made larger than the temperature coefficient of resistor Rs2 by the same ratio and the circuit would be characterized for balance so as to assure the proper heating of the chip and substrate and to provide similar expansion and contraction of these elements.

Terminal 56 of bridge 52 is shown connected to the positive input of an operational amplifier 70 by a connection 72 and to the negative input of a second operational amplifier 74 by a connection 76. Terminal 64 of bridge 52 is shown connected to the positive input of operational amplifier 74 by a connection 78 and to the negative terminal of operational amplifier 70 by a connection 80. Operational amplifier 70 and 74 are powered from a positive voltage source at a terminal 82 by connections 84 and 86 respectively.

The output of operational amplifier 70 is connected to a diode 90 by a connection 92 and diode 90 is connected through a resistor Rh2 identified by reference numeral 94 to signal ground. Resistor Rh2 is the same as the heating resistor 24 of FIG. 1. The output of operational amplifier 74 is connected to a diode 96 by a connection 98 and diode 96 is connected through a resistor Rh1 identified by reference numeral 100 to signal ground. Resistor Rh1 is the same as the heating resistor 22 of FIG. 1. When the chip and substrate have the same thermal coefficient so that the temperature coefficient of Rs1 is the same as Rs2, then there would be no need to characterize the amplifiers 70 and 74 but if they did not have the same coefficient, then, for example, the gain of one of the amplifiers might be adjusted to compensate for the unbalance between Rs1 and Rs2.

OPERATION OF THE PREFERRED EMBODIMENT

As mentioned above, the resistors Rs1 and Rs2 are chosen to have temperature coefficients of resistance which correspond to the thermal coefficients of expansion of the chip 10 and substrate 12 of FIG. 1. At an equilibrium condition, the temperature sensed by resistors Rs1 and Rs2 will be such that the signals on terminals 56 and 64 are equal. Accordingly, the inputs to both operatonal amplifiers 70 and 74 will be equal and the outputs therefrom will be 0. Accordingly, no heating or cooling by resistance Rh1 or Rh2 will occur. Should, however, the use of chip 10 cause it to increase in temperature greater than that of substrate 12, then resistor Rs2 would sense a greater temperature thus producing a positive signal at terminal 64 with respect to terminal 56. Under these circumstances, the positive input to operational amplifier 74 will be greater than the negative input and a positive output signal will occur on output 98. At the same time the negative input signal to operational amplifier 70 will be greater than the positive signal thereto and accordingly a negative signal will appear on output 92 thereof. The negative output on 92 will be blocked by diode 90 so that Rh2 will not heat but the positive output on output 98 will pass through diode 96 and cause current flow through resistor Rh1 and thus increase the heating to substrate 12 in FIG. 1.

On the other hand, if the temperature sensed by resistor Rs1 was greater than the temperature sensed by resistor Rs2, indicating that the chip should receive additional heat, the signal at terminal 56 in FIG. 2 would be greater than that on terminal 64 and thus the positive input to operational amplifier 70 would be greater than the negative input thereto and accordingly a positive signal will appear on output 92. In similar fashion the negative input of operational amplifier 74 would be greater than the positive input thereto and accordingly a negative signal will appear on output 98. This negative signal will be blocked by diode 96 so that no additional heating would occur in Rh1 but the positive signal on output 92 would pass through diode 90 and cause heating of resistor Rh2 to thus increase the temperature of chip 10.

In either case, when the temperatures sensed by Rs1 and Rs2 again become equal, the outputs of amplifiers 70 and 74 would again become zero and the heating would stop until another temperature difference was again encountered. If the amplifiers 70 and 74 have different gains to compensate for different coefficients of expansion for the chip and substrate, then the balance would occur when the temperature found by Rs1 was different than that found by Rs2 but the operation would otherwise be the same.

Accordingly, it is seen that I have provided a circuit for maintaining the temperature of the chip and substrate at such values as to cause their expansion and contraction to be substantially equal and thus relieve the stress on the solder bumps joining the chips to the substrate.

Many changes and alterations will occur to those skilled in the art as, for example, instead of adjusting the temperature coefficients of resistors Ra and Rb correspond to differences in temperature coefficients of expansion of the chip and substrate, compensation could be provided electronically in FIG. 2. Alternate temperature sensing and control circuits may also be devised and accordingly I do not wish to be limited to the specific showings in connection with the preferred embodiment described herein. I intend only to be limited by the following claims.

I claim:

1. Apparatus for use with first and second components joined by connection means to relieve the stress in the connection means due to temperature effects which cause different expansions and contracts between the first and second components comprising:
    first heater means proximate the first component;
    energizing means connected to said first heater means;
    temperature sensing means proximate the first and second components to sense the temperatures thereof; and
    control means connected to said temperature sensing means and to said energizing means and operable in accordance with a first predetermined temperature relationship between the first and second components to energize the said first heater means to heat the first component to an extent sufficient to offset the difference in expansion and contraction of the components.

2. Apparatus according to claim 1 including second heater means connected to said energizing means and proximate the second component, said control means operable in accordance with a second predetermined temperature relationship to energize the second heater means to heat the second component to an extent sufficient to offset the difference in expansion and contraction of the components.

3. Apparatus according to claim 1 wherein the first component is a solid state electronic chip, the second component is a substrate and the connection means includes a solder bump.

4. Apparatus according to claim 2 wherein the first component is a solid state electronic chip, the second component is a substrate and the connection means includes a solder bump.

5. Apparatus according to claim 3 wherein the first heater means is a resistor deposited on the chip.

6. Apparatus according to claim 4 wherein the first heater means is a resistor deposited on the chip and the second heater means is a resistor deposited on the substrate.

7. Apparatus according to claim 4 wherein the temperature sensing means includes a first temperature sensitive resistor deposited on the chip and a second temperature sensitive resistor deposited on the substrate.

8. Apparatus according to claim 7 wherein the control means includes means for comparing the values of the first and second temperature sensitive resistors and to energize the first and second heaters in accordance with the comparison.

9. Apparatus according to claim 2 wherein the control means is characterized to energize the first and second heater means in accordance with the coefficients of thermal expansion of the first and second components.

* * * * *